United States Patent [19]
Sauthier

[11] 3,749,986
[45] July 31, 1973

[54] VARIABLE CAPACITOR

[75] Inventor: Pierre Sauthier, Bienne, Switzerland

[73] Assignee: Omega, Louis Brandt & Frere, S. A., Bienne, Switzerland

[22] Filed: Sept. 5, 1972

[21] Appl. No.: 286,430

[30] Foreign Application Priority Data
Sept. 13, 1971 Great Britain .................. 42,593/71

[52] U.S. Cl. .......... 317/249 R, 317/249 T, 317/258
[51] Int. Cl. .............................................. H01g 5/04
[58] Field of Search .................... 317/249 R, 249 T, 317/246, 258

[56] References Cited
UNITED STATES PATENTS 2,639,315 5/1953 Gutterman ...................... 317/249 R
3,405,333 10/1968 Tilton ............................ 317/249 T

*Primary Examiner*—E. A. Goldberg
*Attorney*—Robert E. Le Blanc, Leonard F. Stoll et al.

[57] ABSTRACT

Disclosed is a variable capacitor for use in tuning the frequency of a crystal oscillator in a wristwatch. The capacitor is of small size but has a large capacitance range. It comprises a doped silicon semiconductor-oxide-chip fabricated according to MOS techniques arranged with an oxide coated surface slidable over a metallic layer formed on an insulated support. The width of the metallic layer varies so that the capacitance between it and the chip changes as the chip is moved along the layer.

7 Claims, 6 Drawing Figures

VARIABLE CAPACITOR

This invention is concerned with providing a variable capacitor which owing to its nature may be made with extremely small physical dimensions whilst at the same time providing a large capacitance range.

Such capacitor may find use for example in providing a fine tuning or frequency adjustment of a quartz crystal controlled oscillator as used for example in a timepiece intended to be worn on the wrist.

Various proposals exist already for such capacitors, but in general, the problem remains of providing sufficient capacitance in a very small space and at the same time, providing a reliable mechanism for varying such capacitance. Some of these previous proposals have suggested the use of air as dielectric but in this instance a capacitor would have to be either of unacceptably large dimensions or would only be usable in connection with an extremely high frequency oscillator for example one oscillating at more than 1 MHz. Where it is desired to use medium or low frequency oscillators the capacitance range is required to be much greater and an air dielectric is impracticable.

The use of ceramic dielectric materials have also been proposed and while these result undoubtedly in a lesser volume for a given capacitance, nevertheless, they occupy more space than is desirable. At the same time they are subject to variations in view of changes in the ambient temperature and humidity and also rather expensive to manufacture.

The present invention seeks to overcome the foregoing problems through the employment of modern integrated circuit technologies, in particular the employment of what is known as metal oxide-semi-conductor (MOS) techniques. Normally, such techniques provide a method of forming transistors, resistors and capacitors directly in the body of a semiconductor material. For example, a wafer of doped n-type silicon has its surface oxidized to $SiO_2$ and the oxidized surface is marked and photo-etched, where it is desired to provide transistors by means of p-type diffusion. Following the deposit of further oxidation layers over the surface, a metallization step is provided, whereby connections may be extended to various regions. In the present invention the manufacture is greatly simplified since there is no need to provide steps wherein different conductivity materials are diffused together. Effectively, a conductive substrate coated with an oxide surface layer, and provided if required with electrical connections, by MOS techniques is used to constitute one plate of the capacitor plus dielectric, the substrate so coated being known as a semi-conductor-oxide-chip. The other plate of the capacitor is provided by a metallic layer on a support. The geometric form of such metallic layer is such that the area thereof may be varied relative to the oxide coated area of the semi-conductor-oxide-chip which is brought in contact therewith. A screw mechanism may be provided in order to facilitate this variation of effective surface contact and thereby the capacitance.

Accordingly, the invention provides a variable capacitor comprising; a support of insulating material which support has a surface bearing a metallic layer thereon, the layer varying in width along a length thereof; a doped silicon semi-conductor-oxide-chip, fabricated according to MOS techniques as herein described, arranged with an oxide coated surface in slidable contact with the metallic layer; means for varying the relative positions of the chip and the metallic layer along said length thereof.

For a better understanding of the invention reference will now be made to the accompanying drawings in which.

Figure 1:
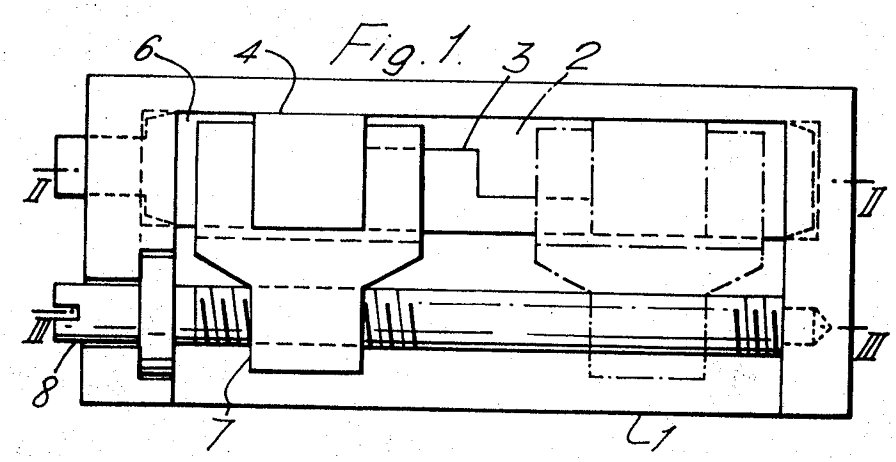
FIG. 1 is a top plan view of a variable capacitor constructed according to this invention.
Figure 5:
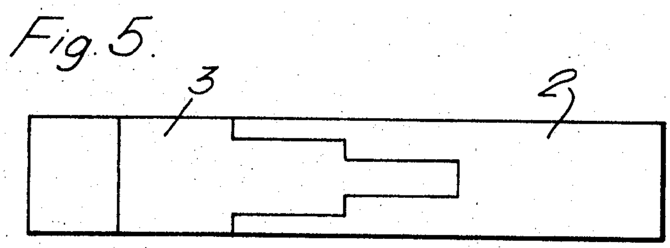
FIG. 5 is a plan view showing a possible form for the metal electrode which in the present embodiment is stationary.
Figure 6:
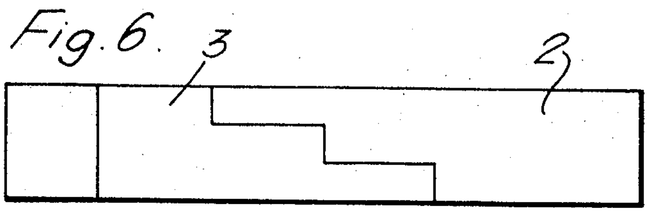
FIG. 6 shows an alternative form for the metal electrode.

As shown in FIG. 1 a container 1 has a rectangular form and is arranged to hold on one inner side thereof an insulating support member 2 on a top surface of which is arranged a metallic layer of a predetermined form, examples of which are to be seen in FIGS. 5 and 6. The reason for the forms shown is to ensure a linear characteristic when the capacitance is altered, that is to say equal displacements should always result in equal changes of capacitance.

Arranged above the support member 2 and its metallized surface layer 3 is a semi-conductor-chip 4 (FIG. 1). This is preferably square in form with a width adapted to the width of the support member 2. This chip is formed from a piece of heavily doped silicon and on the surface which bears against the metallized layer 3 there is provided a layer of oxide ($SiO_2$) which serves as a dielectric. A typical thickness for this oxide layer is in the range of 0,1 m$\mu$ (=1,000 A) to 1 m$\mu$ (=10,000A).

Figure 2:
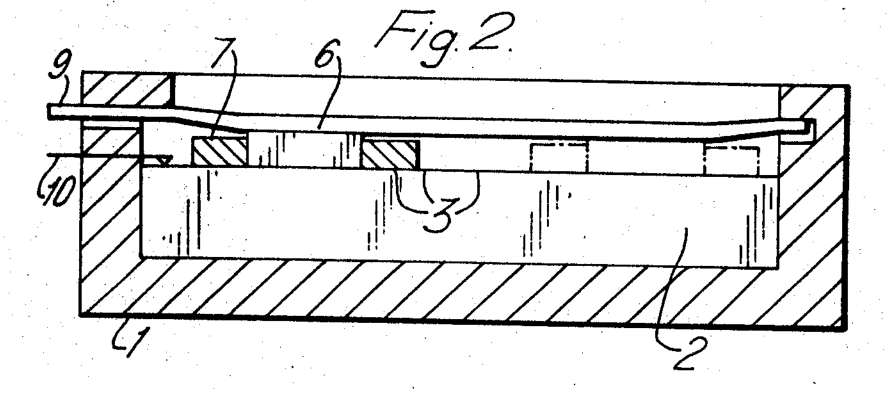
FIG. 2 is a vertical section along line 2—2 of FIG. 1.

A gold-plated spring 6 is arranged to bear against the chip in order to press it into close contact with the metallized surface 3 and at the same time provide a contact which may be led to an external terminal 9 (FIG. 2). Another terminal 10 is arranged to make direct contact with the metallized surface 3 of the support member 2.

Figure 3:
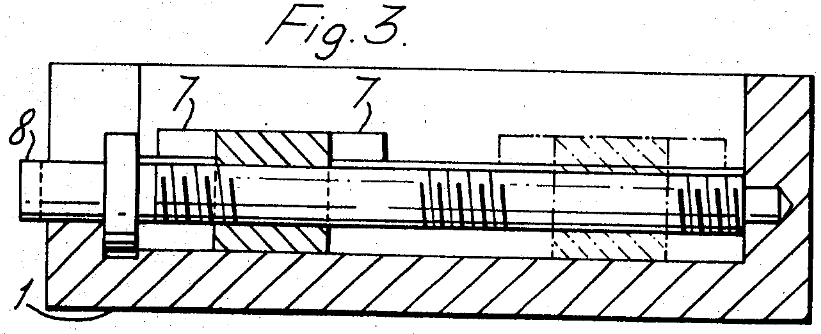
FIG. 3 is a vertical section along line 3—3 of FIG. 1.
Figure 4:
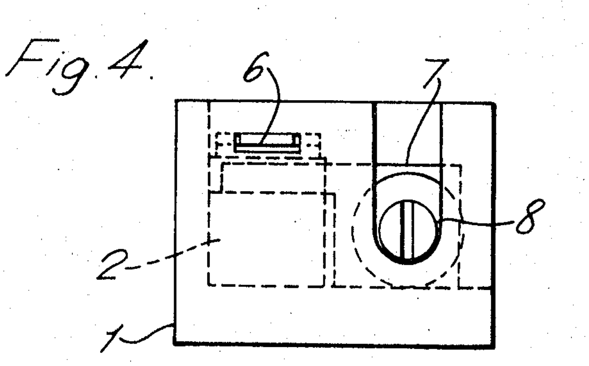
FIG. 4 is an end view of the capacitor.

In order to effect displacement of the chip 4 (FIG. 1) along the surface of the support member 2, a fork member 7 is provided as best seen in FIG. 1. Such fork member as shown in FIGS. 1 and 4 has a threaded bore through which passes a lead screw 8 as shown in FIGS. 1, 3 and 4. The lead screw is arranged to be retained within the supporting container 1 by bearing portions near either end thereof. A slotted end portion extends outside the container where it may be readily engaged by a screwdriver or other adjusting device. It is evident that as the screw is rotated the fork member will be longitudinally displaced thereon and through such displacement will move the chip along the metallized surface of the support member 2 (FIGS. 1 and 4).

It will be readily appreciated that at one end of the device (to the left as shown in full outline in FIG. 1) the oxidized surface of the chip is in contact with a substantially equal area of the metallized surface layer of the support 2. As can be seen from FIGS. 1, 5 and 6, displacements of the chip towards the right result in a linear decrease of the contacting surface areas. In FIG. 5 the metallic surface 3 has a double stepped form with each step having a length equal to the length of the chip. The first step (to the left) is substantially the width of the chip, the second step is two-thirds the width of the first step and the third step is one-third the width of the first step. In the version of FIG. 6 the same proportions are preserved but in a single stepped form. In either version, displacement of the chip toward the right a predetermined percentage of its total possible travel will result in an equal percentage reduction of the contacting areas. Since the capacitance varies directly with the areas in contact,the capacitance likewise decreases in a linear fashion. When the end point is reached, (to the right as shown in dashed outline in FIG. 1) the only remaining capacitance is of a stray or parasitic nature. The form of the metallic surface layer shown in FIG. 5 provides the advantage that the chip receives support in the direction of its movement on both sides thereof, thereby minimizing the danger of creating an undesirable air gap which could lead to transient phenomena.

I claim:

1. A variable capacitor comprising; a support of insulating material which support has a surface bearing a metallic layer thereon, the layer varying in width along a length thereof; a doped silicon semi-conductor-oxide-chip, fabricated according to MOS techniques arranged with an oxide coated surface in slidable contact with the matallic layer; means for varying the relative positions of the chip and the metallic layer along said length thereof.

2. A variable capacitor as defined in claim 1 wherein the width of the metallic surface layer along its length has a stepped form.

3. A variable capacitor so defined in claim 1 wherein the width of the metallic surface layer along its length has a double stepped form.

4. A variable capacitor as defined in claim 3 wherein three discrete steps are provided of which a first step has substantially the same width as the chip, the adjacent step has two thirds the width of the first step and the remote step has one third the width of the first step so that the contacting area of the chip and the metallic surface varies in linear fashion in accordance with their relative positions.

5. A variable capacitor as defined in claim 1 wherein the position varying means comprises a fork member adapted to engage the chip and arranged to be linearly displaced by a lead screw.

6. A variable capacitor as defined in claim 1 wherein a spring member is arranged to bear on one surface of the chip in a manner to ensure close contact between the oxide layer thereof and the metallic surface layer.

7. A variable capacitor as defined in claim 2 wherein three discrete steps are provided of which a first step has substantially the same width as the chip, the adjacent step has two-thirds the width of the first step and the remote step has one-third the width of the first step so that the contacting area of the chip and the metallic surface varies in linear fashion in accordance with their relative positions.

* * * * *